US010658565B2

(12) United States Patent
Clingman

(10) Patent No.: US 10,658,565 B2
(45) Date of Patent: May 19, 2020

(54) ACTUATOR ASSEMBLIES, MECHANICAL ASSEMBLIES INCLUDING THE ACTUATOR ASSEMBLIES, AND METHODS OF FABRICATING THE SAME

(71) Applicant: The Boeing Company, Chicago, IL (US)

(72) Inventor: Daniel John Clingman, Milton, WA (US)

(73) Assignee: The Boeing Company, Chicago, IL (US)

(*) Notice: Subject to any disclaimer, the term of this patent is extended or adjusted under 35 U.S.C. 154(b) by 661 days.

(21) Appl. No.: 15/250,174

(22) Filed: Aug. 29, 2016

(65) Prior Publication Data
US 2018/0062066 A1    Mar. 1, 2018

(51) Int. Cl.
*H01L 41/09* (2006.01)
*H01L 41/29* (2013.01)
*H01L 41/047* (2006.01)

(52) U.S. Cl.
CPC .......... *H01L 41/09* (2013.01); *H01L 41/0471* (2013.01); *H01L 41/0478* (2013.01); *H01L 41/0926* (2013.01); *H01L 41/29* (2013.01)

(58) Field of Classification Search
CPC .................. H01L 41/0471; H01L 41/0478
(Continued)

(56) References Cited

U.S. PATENT DOCUMENTS 5,293,094 A    3/1994 Flynn et al.
5,410,210 A *  4/1995 Sato .................... H01L 41/047
                                                310/332
(Continued)

FOREIGN PATENT DOCUMENTS

DE    10 2012 109250    4/2014
EP    2 765 621         8/2014
(Continued)

OTHER PUBLICATIONS

European Patent Office, Extended European Search Report for related European patent application EP 17176503, dated Jan. 8, 2018.
(Continued)

*Primary Examiner* — Thomas M Dougherty
*Assistant Examiner* — Karen B Addison
(74) *Attorney, Agent, or Firm* — Dascenzo Intellectual Property Law, P.C.

(57) ABSTRACT

Actuator assemblies, mechanical assemblies including the actuator assemblies, and methods of fabricating the same are disclosed herein. The actuator assemblies include a piezoelectric element having a first side and a second side, a first electrode in electrical communication with the first side, and a second electrode in electrical communication with the second side. The first electrode includes a flexible, electrically conductive membrane. The mechanical assemblies include a first structure, which includes a first interface surface, a second structure, which includes a second interface surface, and the actuator assembly. The actuator assembly is configured to provide a motive force for relative motion between the first structure and the second structure. The methods include defining a first electrode on a first side of a piezoelectric element and defining a second electrode on a second side of the piezoelectric element. The first electrode includes a flexible, electrically conductive membrane.

20 Claims, 3 Drawing Sheets

(58) Field of Classification Search
USPC .......................................................... 310/328
See application file for complete search history.

(56) References Cited

U.S. PATENT DOCUMENTS 5,869,189 A * 2/1999 Hagood, IV .......... H01L 41/082
310/357
2007/0257490 A1* 11/2007 Kornbluh ............ F03B 13/1845
290/53

FOREIGN PATENT DOCUMENTS

WO    WO 2001/006579    1/2001
WO    WO 2011/072768    6/2011

OTHER PUBLICATIONS

Machine generated English translation of abstract for DE 10 2012 109250 downloaded from patents.google.com on Feb. 23, 2018.

\* cited by examiner

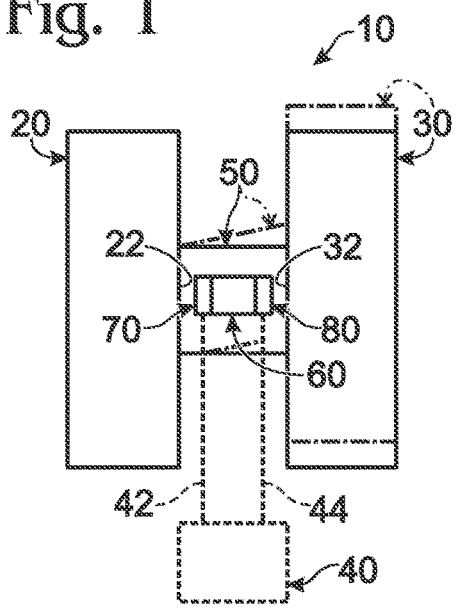
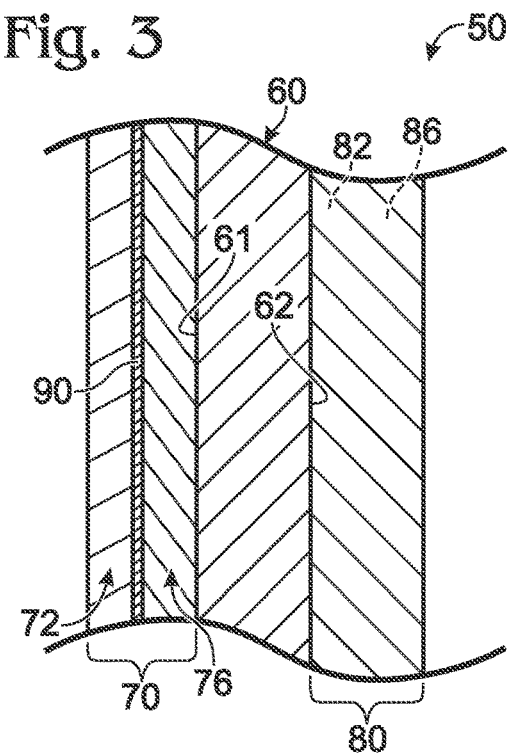
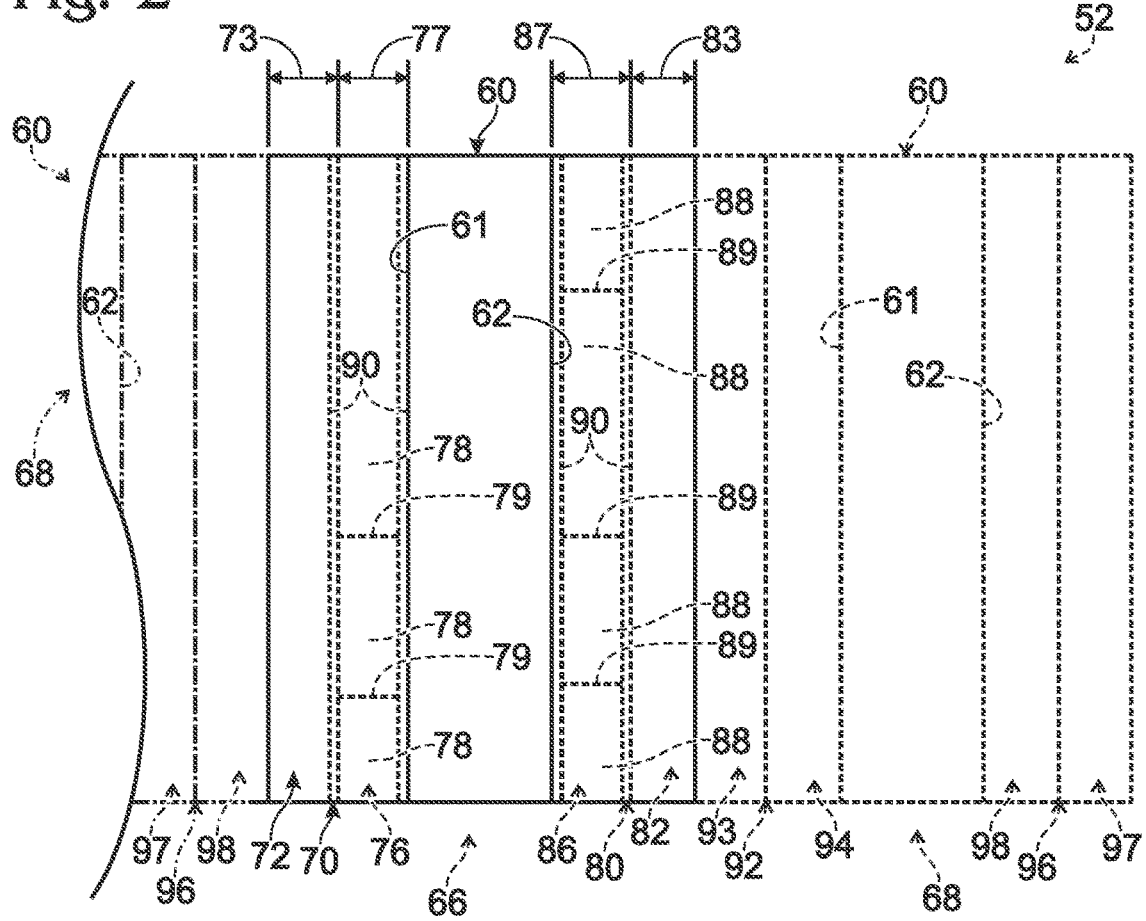

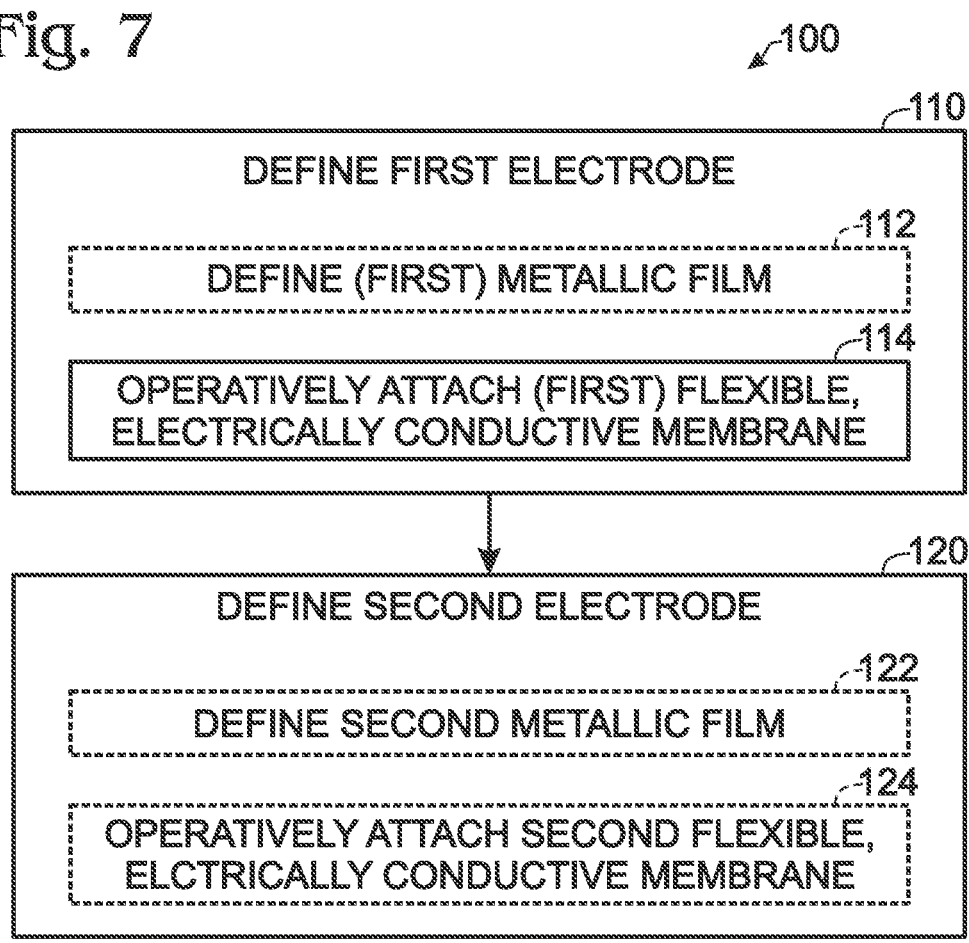

ACTUATOR ASSEMBLIES, MECHANICAL ASSEMBLIES INCLUDING THE ACTUATOR ASSEMBLIES, AND METHODS OF FABRICATING THE SAME

FIELD

The present disclosure relates generally to actuator assemblies, to mechanical assemblies including the actuator assemblies, and to methods of fabricating the same. More specifically, the present disclosure relates to actuator assemblies, mechanical assemblies, and fabrication methods that include and/or utilize a piezoelectric element and at least one electrode that includes a flexible, electrically conductive membrane.

BACKGROUND

Piezoelectric actuators are solid-state devices that may be utilized to convert an electric potential, or voltage, into mechanical motion. Piezoelectric actuators include a piezoelectric element having a first side and an opposed second side, a first metallic electrode deposited on the first side, and a second metallic electrode deposited on the second side. The metallic electrodes provide a mechanism by which the electric potential may be applied to the piezoelectric element, and the piezoelectric element deforms upon application of the electric potential.

When the piezoelectric element deforms, the metallic electrodes also deform, straining the metallic electrodes. This strain may cause the metallic electrodes to work-harden and/or to crack into domains, and the presence of these domains may cause different electrical potentials to be applied to different regions of the piezoelectric element upon application of the electric potential. The variation in electric potential among the domains also may cause electrical arcing among the domains, which may decrease an operational lifetime of the piezoelectric actuator.

Various solutions to the above-described issue have been proposed. As an example, the applied electric potential may be maintained below a threshold value, thereby limiting the strain within the metallic electrodes. As another example, a copper ring may be deposited on the metallic electrodes. While these solutions may be effective under certain circumstances, each has inherent limitations. Thus, there exists a need for improved actuator assemblies and methods of fabricating the same.

SUMMARY

Actuator assemblies, mechanical assemblies including the actuator assemblies, and methods of fabricating the same are disclosed herein. The actuator assemblies include a piezoelectric element having a first side and a second side, a first electrode in electrical communication with the first side, and a second electrode in electrical communication with the second side. The first electrode includes a flexible, electrically conductive membrane.

The mechanical assemblies include a first structure, which includes a first interface surface, a second structure, which includes a second interface surface, and the actuator assembly. The actuator assembly is in contact with both the first interface surface and the second interface surface and is configured to provide a motive force for relative motion between the first structure and the second structure.

The methods include defining a first electrode on a first side of a piezoelectric element and defining a second electrode on a second side of the piezoelectric element. The first electrode includes a flexible, electrically conductive membrane that is in electrical communication with the first side of the piezoelectric element.

BRIEF DESCRIPTION OF THE DRAWINGS

FIG. 1 is a schematic illustration of examples of mechanical assemblies that may include actuator assemblies according to the present disclosure.

FIG. 2 is a schematic representation of examples of actuator assemblies according to the present disclosure.

FIG. 3 is a less schematic partial cross-sectional view of an example of an actuator assembly according to the present disclosure.

FIG. 7 is a flowchart depicting methods of fabricating actuator assemblies, according to the present disclosure.

DESCRIPTION

Figure 4:
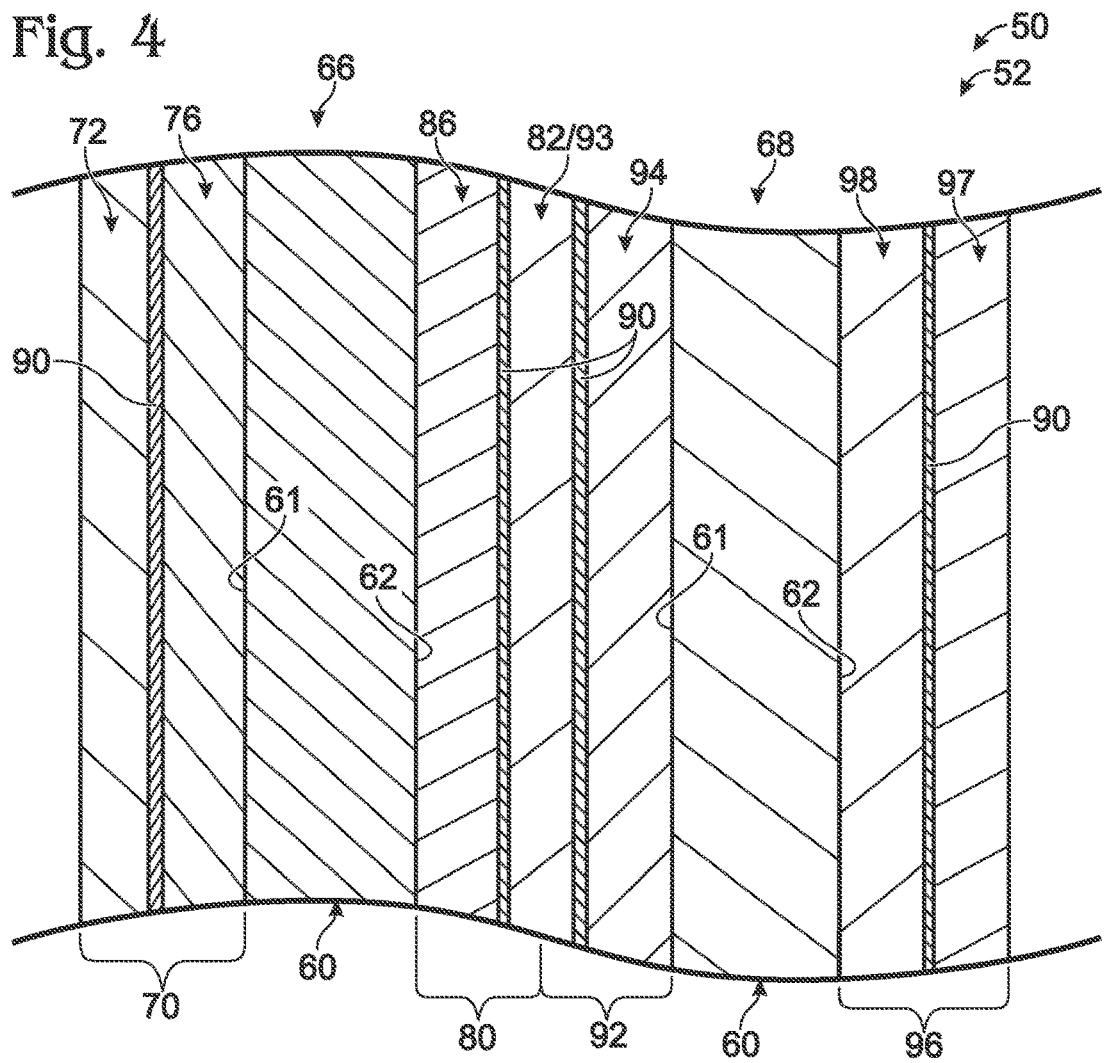
FIG. 4 is a less schematic partial cross-sectional view of an example of an actuator assembly according to the present disclosure.

FIGS. 1-7 provide examples of mechanical assemblies 10, of actuator assemblies 50, and/or of methods 100, according to the present disclosure. Elements that serve a similar, or at least substantially similar, purpose are labeled with like numbers in each of FIGS. 1-7, and these elements may not be discussed in detail herein with reference to each of FIGS. 1-7. Similarly, all elements may not be labeled in each of FIGS. 1-7, but reference numerals associated therewith may be utilized herein for consistency. Elements, components, and/or features that are discussed herein with reference to one or more of FIGS. 1-7 may be included in and/or utilized with any of FIGS. 1-7 without departing from the scope of the present disclosure.

In general, elements that are likely to be included in a given (i.e., a particular) embodiment are illustrated in solid lines, while elements that are optional to a given embodiment are illustrated in dashed lines. However, elements that are shown in solid lines are not essential to all embodiments, and an element shown in solid lines may be omitted from a given embodiment without departing from the scope of the present disclosure.

FIG. 1 is a schematic illustration of examples of mechanical assemblies 10 that may include actuator assemblies 50 according to the present disclosure. As illustrated in FIG. 1, mechanical assemblies 10 include a first structure 20, which includes a first interface surface 22, and a second structure 30, which includes a second interface surface 32. Mechanical assemblies 10 also include an actuator assembly 50. Actuator assembly 50 may be in mechanical communication with both first interface surface 22 and second interface surface 32 and may be adapted, configured, designed, and/or constructed to produce and/or generate a motive force for, or to generate, relative motion between first structure 20 and second structure 30. As an example, actuator assemblies 50 may be configured to transition the first structure and the second structure between a first relative orientation, as illustrated in solid lines in FIG. 1, to a second relative orientation, as illustrated in FIG. 1 by the dash-dot lines for actuator assembly 50 and second structure 30.

As discussed in more detail herein with reference to actuator assemblies 50 of FIGS. 2-4, actuator assemblies according to the present disclosure may include a piezoelectric element 60, a first electrode 70, and a second electrode 80, and actuator assembly 50 may be configured to transition first structure 20 and second structure 30 between the first relative orientation and the second relative orientation responsive to application of a voltage, potential, or potential difference between first electrode 70 and second electrode 80. As an example, piezoelectric element 60 may deform responsive to application of the voltage, thereby changing the relative orientation of first structure 20 and second structure 30.

As illustrated in dashed lines in FIG. 1, mechanical assembly 10 also may include a first electrical conductor 42, a second electrical conductor 44, and a voltage source 40. First electrical conductor 42 may be in electrical communication with first electrode 70 and also with voltage source 40. Similarly, second electrical conductor 44 may be in electrical communication with second electrode 80 and also with voltage source 40. During operation of mechanical assembly 10, voltage source 40 may apply the voltage between first electrode 70 and second electrode 80 via first electrical conductor 42 and second electrical conductor 44, respectively; and piezoelectric element 60 may deform responsive to application of the voltage. This deformation of piezoelectric element 60 may cause and/or generate the change in the relative orientation of first structure 20 and second structure 30.

FIG. 2 is a schematic representation of examples of actuator assemblies 50 according to the present disclosure, while FIGS. 3-4 are less schematic partial cross-sectional views illustrating more specific examples of actuator assemblies 50. As illustrated in solid lines in FIGS. 2-4, actuator assemblies 50 include a piezoelectric element 60, which has a first side 61 and an opposed second side 62. As also illustrated in solid lines in FIGS. 2-4, actuator assemblies 50 include a first electrode 70 and a second electrode 80. First electrode 70 is in electrical communication with first side 61 of piezoelectric element 60 and second electrode 80 is in electrical communication with second side 62 of piezoelectric element 60. Stated another way, piezoelectric element 60 extends between and/or spatially separates first electrode 70 and second electrode 80.

First electrode 70 includes, or is, a flexible, electrically conductive membrane 72. Flexible, electrically conductive membrane 72 also may be referred to herein as and/or may be a first flexible, electrically conductive membrane 72, an electrically conductive membrane 72, and/or a membrane 72. Membrane 72 also may be referred to herein as a veil 72, a cover 72, a covering 72, a layer 72, a sheet 72, a film 72, and/or a pellicle 72.

In contrast to prior art piezoelectric actuators, which are discussed herein and include two metallic electrodes, at least one electrode of piezoelectric actuators 50 according to the present disclosure (e.g., at least first electrode 70) includes flexible, electrically conductive membrane 72. Flexible, electrically conductive membrane 72 may be adapted, configured, designed, constructed, fabricated, and/or selected to deform with piezoelectric element 60, or to undergo the strain that is inherent to deformation of piezoelectric element 60, without work-hardening and/or cracking, as is common with metallic electrodes. Thus, the presence of flexible, electrically conductive membrane 72 within first electrode 70 may permit operation of actuator assemblies 50, according to the present disclosure, over a wider range of deformation and/or over a longer timeframe, when compared to prior art piezoelectric actuators, without degradation in the performance of actuator assemblies 50 due to differing electrical potentials and/or arcing across an electrode thereof, as discussed herein.

Flexible, electrically conductive membrane 72 may include any suitable material and/or materials of construction. As an example, flexible, electrically conductive membrane 72 may be non-metallic, may be primarily non-metallic, may consist of a non-metallic material, may consist essentially of a non-metallic material, and/or may include less than a threshold fraction of a metallic component. Examples of the threshold fraction of the metallic component include less than 50 weight percent (wt %), less than 40 wt %, less than 30 wt %, less than 20 wt %, less than 10 wt %, less than 5 wt %, or less than 1 wt % of the metallic component. Stated another way, flexible, electrically conductive membrane 72 may be both flexible and electrically conductive, and neither the flexibility nor the electrical conductivity of flexible, electrically conductive membrane 72 may be caused by, or based primarily on, the presence of a metallic component therein. Stated yet another way, flexible, electrically conductive membrane 72 generally is not, and does not include, a metallic film.

As more specific examples, flexible, electrically conductive membrane 72 may include, be, consist of, and/or consist essentially of one or more of an organic membrane, a polymeric membrane, a carbon fiber membrane, and/or a mat-weave carbon fiber membrane. As additional and/or alternative examples, flexible, electrically conductive membrane 72 may include, be, consist of, and/or consist essentially of one or more of a resin-impregnated membrane, an epoxy-impregnated membrane, a polymer-impregnated membrane, an electrically conductive resin-impregnated membrane, an electrically conductive epoxy-impregnated membrane, and/or an electrically conductive polymer-impregnated membrane.

As discussed, flexible, electrically conductive membrane 72 may be flexible. This flexibility may permit flexible, electrically conductive membrane 72 to deform with piezoelectric element 60 and/or to undergo the strain that is associated with deformation of piezoelectric element 60 without damage to and/or destruction of flexible, electrically conductive membrane 72. Additionally or alternatively, this flexibility may permit flexible, electrically conductive membrane 72 to be bonded, attached, and/or directly attached to piezoelectric element 60 without inhibiting, without significantly inhibiting, and/or without restricting, deformation of piezoelectric element 60.

With this in mind, flexible, electrically conductive membrane 72 may be referred to herein as having a stretching stiffness, a modulus of extension, an extension modulus, a modulus of elasticity, and/or a Young's Modulus that is less than a threshold value and/or that is within a specified stiffness range. As examples, the stretching stiffness, the modulus of extension, the extension modulus, the modulus of elasticity, and/or the Young's Modulus of flexible, electrically conductive membrane 72 may be at most 20 gigapascals (GPa), at most 15 GPa, at most 10 GPa, at most 7.5 GPa, at most 5 GPa, at most 4 GPa, at most 3 GPa, at most 2 GPa, and/or at most 1 GPa. Additionally or alternatively, the stretching stiffness, the modulus of extension, the extension modulus, the modulus of elasticity, and/or the Young's Modulus of flexible, electrically conductive membrane 72 may be at least 0.01 GPa, at least 0.025 GPa, at least 0.05 GPa, at least 0.075 GPa, at least 0.1 GPa, at least 0.25 GPa, at least 0.5 GPa, at least 0.75 GPa, and/or at least 1 GPa.

Flexible, electrically conductive membrane 72 additionally or alternatively may be thin, may have less than a threshold membrane thickness 73, or first membrane thickness 73, and/or may have a membrane thickness 73 that is within a specified thickness range. This is illustrated in FIG. 2. As examples, the membrane thickness 73 may be at most 250 micrometers, at most 200 micrometers, at most 175 micrometers, at most 150 micrometers, at most 125 micrometers, at most 100 micrometers, at most 80 micrometers, at most 60 micrometers, and/or at most 50 micrometers. Additionally or alternatively, the membrane thickness 73 may be at least 10 micrometers, at least 20 micrometers, at least 30 micrometers, at least 40 micrometers, at least 50 micrometers, at least 75 micrometers, and/or at least 100 micrometers.

It is within the scope of the present disclosure that flexible, electrically conductive membrane 72 may be in direct physical and/or electrical contact with first side 61 of piezoelectric element 60. Additionally or alternatively, flexible, electrically conductive membrane 72 may be bonded, or directly bonded, to first side 61 of piezoelectric element 60, such as via and/or utilizing an electrically conductive bonding agent 90. Examples of electrically conductive bonding agent 90 include one or more of an electrically conductive adhesive, an electrically conductive resin, an electrically conductive epoxy, a carbon-impregnated epoxy, and/or a carbon fiber-impregnated epoxy.

As illustrated in dashed lines in FIG. 2 and in solid lines in FIGS. 3-4, first electrode 70 further may include a metallic film 76, which also may be referred to herein as a first metallic film 76. Metallic film 76, when present, may extend between, or entirely between, first side 61 of piezoelectric element 60 and flexible, electrically conductive membrane 72. Additionally or alternatively, metallic film 76 may electrically interconnect first side 61 of piezoelectric element 60 and flexible, electrically conductive membrane 72.

Metallic film 76, when present, may have any suitable film thickness 77, which also may be referred to herein as a first film thickness 77 and is illustrated in FIG. 2. As examples, film thickness 77 may be at least at least 0.01 micrometers, at least 0.05 micrometers, at least 0.1 micrometers, and/or at least 0.5 micrometers. Additionally or alternatively, film thickness 77 may be at most 5 micrometers, at most 4 micrometers, at most 3 micrometers, at most 2 micrometers, at most 1 micrometer, and/or at most 0.5 micrometers. When first electrode 70 includes metallic film 76, electrically conductive bonding agent 90 may bond flexible, electrically conductive membrane 72 to metallic film 76, may extend between flexible, electrically conductive membrane 72 and metallic film 76, and/or may electrically interconnect at least a portion of flexible, electrically conductive membrane 72 with at least a portion of metallic film 76.

When first electrode 70 includes both flexible, electrically conductive membrane 72 and metallic film 76, and as illustrated in FIG. 2, metallic film 76 still may develop cracks 79 upon actuation of actuator assembly 50. In addition, cracks 79 may separate metallic film 76 into a plurality of film regions 78. However, flexible, electrically conductive membrane 72 may electrically interconnect, or shunt, film regions 78, thereby maintaining film regions 78 at the same, or at substantially the same, electrical potential during actuation of actuator assembly 50. Thus, the presence of flexible, electrically conductive membrane 72 may prevent arcing between film regions 78, thereby preventing damage to actuator assembly 50 and/or prolonging an operational life of actuator assembly 50.

Second electrode 80 may include any suitable structure that may be in electrical communication with second side 62 of piezoelectric element 60. In addition, a structure and/or componentry of second electrode 80 may be similar to, may be identical to, may be a mirror image of, and/or may be different from a structure and/or componentry of first electrode 70. With this in mind, and generally speaking, any of the structures, functions, and/or features that are disclosed herein with reference to first electrode 70 may be included in and/or utilized with second electrode 80 without departing from the scope of the present disclosure.

As an example, and as illustrated in dashed lines in FIGS. 2-3 and in solid lines in FIG. 4, second electrode 80 may include a second flexible, electrically conductive membrane 82. Second flexible, electrically conductive membrane 82 may be in direct, in direct physical, and/or in direct electrical contact with second side 62 of piezoelectric element 60. Additionally or alternatively, second flexible, electrically conductive membrane 82 may be bonded, or directly bonded, to second side 62 of piezoelectric element 60, such as via and/or utilizing electrically conductive bonding agent 90, which is discussed in more detail herein. Second flexible, electrically conductive membrane 82, when present, may have and/or define any suitable second membrane thickness 83, examples of which are disclosed herein with reference to first membrane thickness 73. In addition, second flexible, electrically conductive membrane 82, when present, may include any suitable material and/or materials of construction, examples of which are disclosed herein with reference to first flexible, electrically conductive membrane 72.

As illustrated in dashed lines in FIG. 2 and in solid lines in FIGS. 3-4, second electrode 80 additionally or alternatively may include a second metallic film 86. When second electrode 80 includes second metallic film 86, second electrode 80 may not include, or utilize, second flexible electrically conductive membrane 82. This is illustrated in dashed lines FIG. 3.

Alternatively, second electrode 80 may include both second flexible, electrically conductive membrane 82 and second metallic film 86, and second metallic film 86 may extend between, may extend entirely between, and/or may electrically interconnect second side 62 of piezoelectric element 60 and second flexible, electrically conductive membrane 82. Second metallic film 86, when present, may have and/or define any suitable second film thickness 87, examples of which are disclosed herein with reference to first film thickness 77.

Similar to first electrode 70, and upon actuation of actuator assemblies 50 that include a second electrode 80 that includes both second flexible, electrically conductive membrane 82 and second metallic film 86, second metallic film 86 may develop second cracks 89. Second cracks 89 may separate second metallic film 86 into two or more second film regions 88. However, second flexible, electrically conductive membrane 82 may electrically interconnect, or shunt, second film regions 88, thereby preventing arcing therebetween.

It is within the scope of the present disclosure that actuator assemblies 50, which are disclosed herein, may include, or be, unimorph piezoelectric actuators. Such a unimorph piezoelectric actuator includes only a single piezoelectric element 60 and is illustrated in solid lines in FIGS. 2-3.

Alternatively, it is also within the scope of the present disclosure that actuator assemblies 50 disclosed herein may include, or be, bimorph, or even multimorph, piezoelectric actuators. Bimorph piezoelectric actuators include two piezoelectric elements 60 and are illustrated in solid lines in FIG. 4 and in solid and dashed or dash-dot lines in FIG. 2. Multimorph piezoelectric actuators include two or more piezoelectric elements 60. Such bimorph, or multimorph, piezoelectric actuators may include a stack of two or more piezoelectric actuators, each including a corresponding piezoelectric element 60 and corresponding electrodes on each side of the corresponding piezoelectric element. Such a configuration may be referred to herein as a piezoelectric stack 52.

As an example, and as illustrated in FIGS. 2 and 4, actuator assemblies 50 may include a first piezoelectric element 66 and a second piezoelectric element 68. First piezoelectric element 66 may be associated with, or actuated by, first electrode 70 and second electrode 80, as discussed herein. Second piezoelectric element 68 may be associated with, or actuated by, a third electrode 92, which may be in electrical communication with a first side 61 of second piezoelectric element 68, and a fourth electrode 96, which may be in electrical communication with a second side 62 of second piezoelectric element 68.

It is within the scope of the present disclosure that first side 61 of first piezoelectric element 66 may face toward second side 62 of second piezoelectric element 68, as illustrated in solid and in dash-dot lines in FIG. 2. Under these conditions, flexible, electrically conductive membrane 72 may extend between first electrode 70 and fourth electrode 96.

Alternatively, it is also within the scope of the present disclosure that first side 61 of first piezoelectric element 66 may face away from second piezoelectric element 68. This is illustrated in solid and in dashed lines in FIG. 2 and in FIG. 4.

As illustrated in FIGS. 2 and 4, third electrode 92 may include a corresponding third flexible, electrically conductive membrane 93 and/or a corresponding third metallic film 94. Similarly, fourth electrode 96 may include a corresponding fourth flexible, electrically conductive membrane 97 and/or a corresponding fourth metallic film 98.

FIG. 4 also illustrates that electrodes that face toward one another may share one or more components thereof. As an example, FIG. 4 illustrates an embodiment in which a single flexible, electrically conductive membrane may function as both second flexible, electrically conductive membrane 82 a third flexible, electrically conductive membrane 93. As another example, and with continued reference to FIG. 4, it is within the scope of the present disclosure that second electrode 80 and third electrode 92 may share a common metallic film, such as second metallic film 86 and/or third metallic film 94.

Piezoelectric elements 60 may include any suitable structure and/or material that may be adapted, configured, designed, fabricated, formulated, synthesized, and/or constructed to deform upon application of a voltage thereto. As an example, piezoelectric elements 60 may include, or be, ceramic piezoelectric elements. As additional and/or more specific examples, piezoelectric elements 60 may include, or be, one or more of a quartz element, a berlinite element, a lead titanate element, a langasite element, a gallium orthophosphate element, a lithium niobate element, a lithium tanalate element, a barium titanate element, a lead zirconate titanate element, a potassium niobate element, a sodium tungstate element, a zinc oxide element, a ceramic element, a piezoceramic element, a sodium potassium niobate element, a bismuth ferrite element, a sodium niobate element, a bismuth titanate element, a sodium bismuth titanate element, a III-V semiconductor element, a II-VI semiconductor element, and a polyvinylidene fluoride element.

Figure 5:
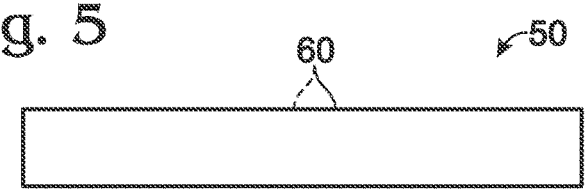
FIG. 5 is a schematic top view illustrating an example of an actuator assembly according to the present disclosure.
Figure 6:
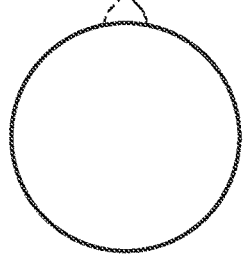
FIG. 6 is a schematic top view illustrating an example of an actuator assembly according to the present disclosure.

Piezoelectric elements 60 and/or actuator assemblies 50 that include piezoelectric elements 60 may have and/or define any suitable shape. As an example, and as illustrated in FIG. 5, piezoelectric elements 60 may have and/or define a rectangular-shape and/or a beam-shape. As another example, and as illustrated in FIG. 6, piezoelectric elements 60 may have and/or define a disc-shape.

FIG. 7 is a flowchart depicting methods 100 of fabricating actuator assemblies, such as actuator assemblies 50, according to the present disclosure. Methods 100 include defining a first electrode at 110 and defining a second electrode at 120.

Defining the first electrode at 110 includes defining the first electrode on a first side of a piezoelectric element. The defining at 110 may include defining a metallic film, or a first metallic film, on the first side of the piezoelectric element, as indicated at 112, and includes operatively attaching a flexible, electrically conductive membrane, or a first flexible, electrically conductive membrane, to the first side of the piezoelectric element, as indicated at 114.

When methods 100 include the defining at 112, the defining at 112 may be performed prior to the operatively attaching at 114. The defining at 112 may be performed in any suitable manner. As an example, the defining at 112 may include depositing the metallic film on, or directly on, the first side of the piezoelectric element. Examples of the metallic film are disclosed herein with reference to metallic film 76 of FIGS. 2-4.

The operatively attaching at 114 may include operatively attaching the flexible, electrically conductive membrane to the first side of the piezoelectric element and/or operatively attaching the flexible, electrically conductive membrane such that the flexible, electrically conductive membrane is in electrical communication with the first side of the piezoelectric element. As an example, the operatively attaching at 114 may include directly and/or operatively adhering, or bonding, the flexible, electrically conductive membrane to the first side of the piezoelectric element, such as via and/or utilizing any suitable electrically conductive bonding agent. Examples of the flexible, electrically conductive membrane are disclosed herein with reference to flexible, electrically conductive membrane 72 of FIGS. 2-4. Examples of the electrically conductive bonding agent are disclosed herein with reference to electrically conductive bonding agent 90 of FIGS. 2-4.

When methods 100 include the defining at 112, the operatively attaching at 114 may include operatively attaching the flexible, electrically conductive membrane such that the metallic film extends between, extends entirely between, and/or electrically separates the first side of the piezoelectric element and the flexible, electrically conductive membrane. Additionally or alternatively, the operatively attaching at 114 may include operatively attaching the flexible, electrically conductive membrane to the metallic film, such as via and/or utilizing the electrically conductive bonding agent.

Defining the second electrode at 120 includes defining the second electrode on a second side of the piezoelectric element. This may include defining a second metallic film, as indicated at 122, and/or operatively attaching a second flexible, electrically conductive membrane, as indicated at 124. The defining at 122 may be similar, or at least substantially similar, to the defining at 112. In addition, the operatively attaching at 124 may be similar, or at least substantially similar, to the operatively attaching at 114.

Illustrative, non-exclusive examples of inventive subject matter according to the present disclosure are described in the following enumerated paragraphs:

A1. An actuator assembly, comprising:
a piezoelectric element having a first side and an opposed second side;
a first electrode in electrical communication with the first side, wherein the first electrode includes, and optionally is, a flexible, electrically conductive membrane; and
a second electrode in electrical communication with the second side.

A2. The actuator assembly of paragraph A1, wherein the flexible, electrically conductive membrane includes, and optionally is, at least one of:
(i) an organic membrane;
(ii) a polymeric membrane;
(iii) a carbon fiber membrane; and
(iv) a mat-weave carbon fiber membrane.

A3. The actuator assembly of any of paragraphs A1-A2, wherein the flexible, electrically conductive membrane is non-metallic.

A4. The actuator assembly of any of paragraphs A1-A3, wherein the flexible, electrically conductive membrane includes, and optionally is, at least one of:
(i) a resin-impregnated membrane;
(ii) an epoxy-impregnated membrane;
(iii) a polymer-impregnated membrane;
(iv) an electrically conductive resin-impregnated membrane;
(v) an electrically conductive epoxy-impregnated membrane; and
(vi) an electrically conductive polymer-impregnated membrane.

A5. The actuator assembly of any of paragraphs A1-A4, wherein the flexible, electrically conductive membrane has a stretching stiffness, a modulus of extension, an extension modulus, a modulus of elasticity, or a Young's Modulus, of at least one of:
(i) at least 0.01 gigapascals (GPa), at least 0.025 GPa, at least 0.05 GPa, at least 0.075 GPa, at least 0.1 GPa, at least 0.25 GPa, at least 0.5 GPa, at least 0.75 GPa, or at least 1 GPa; and at most 20 GPa, at most 15 GPa, at most 10 GPa, at most 7.5 GPa, at most 5 GPa, at most 4 GPa, at most 3 GPa, at most 2 GPa, or at most 1 GPa.

A6. The actuator assembly of any of paragraphs A1-A5, wherein the flexible, electrically conductive membrane has a membrane thickness of at least one of:
(i) at least 10 micrometers, at least 20 micrometers, at least 30 micrometers, at least 40 micrometers, at least 50 micrometers, at least 75 micrometers, or at least 100 micrometers; and at most 250 micrometers, at most 200 micrometers, at most 175 micrometers, at most 150 micrometers, at most 125 micrometers, at most 100 micrometers, at most 80 micrometers, at most 60 micrometers, or at most 50 micrometers.

A7. The actuator assembly of any of paragraphs A1-A6, wherein the flexible, electrically conductive membrane is in direct physical contact with the first side of the piezoelectric element.

A8. The actuator assembly of any of paragraphs A1-A7, wherein the flexible, electrically conductive membrane is bonded, and optionally directly bonded, to the first side of the piezoelectric element.

A9. The actuator assembly of any of paragraphs A1-A8, wherein the actuator assembly further includes an electrically conductive bonding agent that bonds the flexible, electrically conductive membrane to the first side of the piezoelectric element.

A10. The actuator assembly of paragraph A9, wherein the electrically conductive bonding agent includes at least one of:
(i) an electrically conductive adhesive;
(ii) an electrically conductive resin;
(iii) an electrically conductive epoxy;
(iv) a carbon-impregnated epoxy; and
(v) a carbon fiber-impregnated epoxy.

A11. The actuator assembly of any of paragraphs A1-A10, wherein the first electrode further includes a metallic film, or a first metallic film.

A12. The actuator assembly of paragraph A11, wherein the metallic film, or the first metallic film, extends between, and electrically interconnects, the first side of the piezoelectric element and the flexible, electrically conductive membrane.

A13. The actuator assembly of any of paragraphs A11-A12, wherein the metallic film, or the first metallic film, has a film thickness, or a first film thickness, of at least one of:
(i) at least 0.01 micrometers, at least 0.05 micrometers, at least 0.1 micrometers, or at least 0.5 micrometers; and at most 5 micrometers, at most 4 micrometers, at most 3 micrometers, at most 2 micrometers, at most 1 micrometer, or at most 0.5 micrometers.

A14. The actuator assembly of any of paragraphs A11-A13, wherein the actuator assembly further includes an/the electrically conductive bonding agent that bonds the flexible, electrically conductive membrane to the metallic film, or to the first metallic film.

A15. The actuator assembly of paragraph A14, wherein the electrically conductive bonding agent includes at least one of:
(i) an electrically conductive adhesive;
(ii) an electrically conductive resin;
(iii) an electrically conductive epoxy;
(iv) a carbon-impregnated epoxy; and
(v) a carbon fiber-impregnated epoxy.

A16. The actuator assembly of any of paragraphs A11-A15, wherein the metallic film, or the first metallic film, includes a plurality of film regions separated by a plurality of cracks and further wherein the flexible, electrically conductive membrane electrically interconnects, or shunts, the plurality of film regions.

A17. The actuator assembly of any of paragraphs A1-A16, wherein the flexible, electrically conductive membrane is a first flexible, electrically conductive membrane, and further wherein the second electrode includes a second flexible, electrically conductive membrane.

A18. The actuator assembly of paragraph A17, wherein the second flexible, electrically conductive membrane is in direct physical contact with the second side of the piezoelectric element.

A19. The actuator assembly of any of paragraphs A17-A18, wherein the second flexible, electrically conductive membrane is bonded, and optionally directly bonded, to the second side of the piezoelectric element.

A20. The actuator assembly of any of paragraphs A17-A19, wherein the actuator assembly further includes an/the electrically conductive bonding agent that bonds the second flexible, electrically conductive membrane to the second side of the piezoelectric element.

A21. The actuator assembly of paragraph A20, wherein the electrically conductive bonding agent includes at least one of:

(i) an/the electrically conductive adhesive;
(ii) an/the electrically conductive resin;
(iii) an/the electrically conductive epoxy;
(iv) a/the carbon-impregnated epoxy; and
(v) a/the carbon fiber-impregnated epoxy.

A22. The actuator assembly of any of paragraphs A1-A21, wherein the second electrode further includes a/the metallic film, or a second metallic film.

A23. The actuator assembly of paragraph A22, wherein the metallic film, or the second metallic film, extends between, and electrically interconnects, the second side of the piezoelectric element and a/the second flexible, electrically conductive membrane.

A24. The actuator assembly of any of paragraphs A22-A23, wherein the metallic film, or the second metallic film, has a film thickness, or a second film thickness, of at least one of:
(i) at least 0.01 micrometers, at least 0.05 micrometers, at least 0.1 micrometers, or at least 0.5 micrometers; and at most 5 micrometers, at most 4 micrometers, at most 3 micrometers, at most 2 micrometers, at most 1 micrometer, or at most 0.5 micrometers.

A25. The actuator assembly of any of paragraphs A22-A24, wherein the actuator assembly further includes an/the electrically conductive bonding agent that bonds the second flexible, electrically conductive membrane to the metallic film, or to the second metallic film.

A26. The actuator assembly of paragraph A25, wherein the electrically conductive bonding agent includes at least one of:
(i) an electrically conductive adhesive;
(ii) an electrically conductive resin;
(iii) an electrically conductive epoxy;
(iv) a carbon-impregnated epoxy; and
(v) a carbon fiber-impregnated epoxy.

A27. The actuator assembly of any of paragraphs A22-A26, wherein the metallic film, or the second metallic film, includes a plurality of film regions, or a plurality of second film regions, separated by a plurality of cracks, or a plurality of second cracks, and further wherein the second flexible, electrically conductive membrane electrically interconnects, or shunts, the plurality of film regions, or the plurality of second film regions.

A28. The actuator assembly of any of paragraphs A1-A27, wherein the actuator assembly includes, or is, a unimorph piezoelectric actuator.

A29. The actuator assembly of any of paragraphs A1-A28, wherein the actuator assembly includes, or is, a bimorph piezoelectric actuator.

A30. The actuator assembly of any of paragraphs A1-A29, wherein the piezoelectric element is a first piezoelectric element, and further wherein the actuator assembly includes a second piezoelectric element.

A31. The actuator assembly of paragraph A30, wherein the actuator assembly further includes a third electrode in electrical communication with a first side of the second piezoelectric element and a fourth electrode in electrical communication with a second side of the second piezoelectric element, wherein the first side of the second piezoelectric element is opposed to the second side of the second piezoelectric element.

A32. The actuator assembly of any of paragraphs A30-A31, wherein the first piezoelectric element and the second piezoelectric element are arranged in a piezoelectric stack.

A33. The actuator assembly of any of paragraphs A30-A32, wherein the first side of the first piezoelectric element faces toward the second side of the second piezoelectric element within the piezoelectric stack.

A34. The actuator assembly of paragraph A33, wherein the flexible, electrically conductive membrane extends between the first electrode and the fourth electrode.

A35. The actuator assembly of any of paragraphs A33-A34, wherein the flexible, electrically conductive membrane is a/the first flexible, electrically conductive membrane, and further wherein:
(i) the second electrode includes, and optionally is, a/the second flexible, electrically conductive membrane; and
(ii) the third electrode includes, and optionally is, a third flexible, electrically conductive membrane.

A36. The actuator assembly of any of paragraphs A30-A32, wherein the first side of the first piezoelectric element faces away from the second piezoelectric element within the piezoelectric stack.

A37. The actuator assembly of any of paragraphs A1-A36, wherein the piezoelectric element includes at least one of a quartz element, a berlinite element, a lead titanate element, a langasite element, a gallium orthophosphate element, a lithium niobate element, a lithium tanalate element, a barium titanate element, a lead zirconate titanate element, a potassium niobate element, a sodium tungstate element, a zinc oxide element, a ceramic element, a piezoceramic element, a sodium potassium niobate element, a bismuth ferrite element, a sodium niobate element, a bismuth titanate element, a sodium bismuth titanate element, a III-V semiconductor element, a II-VI semiconductor element, and a polyvinylidene fluoride element.

A38. The actuator assembly of any of paragraphs A1-A37, wherein the piezoelectric element includes, and optionally is, a ceramic piezoelectric element.

A39. The actuator assembly of any of paragraphs A1-A38, wherein the piezoelectric element is disc-shaped.

A40. The actuator assembly of any of paragraphs A1-A39, wherein the piezoelectric element is beam-shaped.

B1. A mechanical assembly, comprising:
a first structure including a first interface surface;
a second structure including a second interface surface; and
the actuator assembly of any of paragraphs A1-A40, wherein the actuator assembly is in mechanical contact with the first interface surface of the first structure and also with the second interface surface of the second structure and is configured to provide a motive force for relative motion between the first structure and the second structure.

B2. The mechanical assembly of paragraph B1, wherein the assembly further includes:
a first electrical conductor in electrical communication with the first electrode;
a second electrical conductor in electrical communication with the second electrode; and
a voltage source configured to apply a voltage between the first electrode and the second electrode via the first electrical conductor and the second electrical conductor.

C1. A method of fabricating an actuator assembly, the method comprising:
defining a first electrode on a first side of a piezoelectric element, wherein the defining the first electrode includes operatively attaching a flexible, electrically conductive membrane to the first side of the piezoelectric element such that the flexible, electrically conductive membrane is in electrical communication with the first side of the piezoelectric element; and
defining a second electrode on a second side of the piezoelectric element.

C2. The method of paragraph C1, wherein the defining the first electrode further includes defining a metallic film, or a first metallic film, on the first side of the piezoelectric element, wherein the defining the metallic film, or the first metallic film, is prior to the operatively attaching the flexible, electrically conductive membrane, and further wherein the operatively attaching the flexible, electrically conductive membrane includes operatively attaching such that the metallic film, or the first metallic film, extends between, and electrically separates, the first side of the piezoelectric element and the flexible, electrically conductive membrane.

C3. The method of paragraph C2, wherein the defining the metallic film, or the first metallic film, includes depositing the metallic film, or the first metallic film, on the first side of the piezoelectric element.

C4. The method of any of paragraphs C1-C3, wherein flexible, electrically conductive membrane is a first flexible, electrically conductive membrane, and further wherein the defining the second electrode includes operatively attaching a second flexible, electrically conductive membrane to the second side of the piezoelectric element such that the second flexible, electrically conductive membrane is in electrical communication with the second side of the piezoelectric element.

C5. The method of any of paragraphs C1-C4, wherein the defining the second electrode includes defining a metallic film, or a second metallic film, on the second side of the piezoelectric element.

C6. The method of paragraph C5, wherein the defining the metallic film, or the second metallic film, includes depositing the metallic film, or the second metallic film, on the second side of the piezoelectric element.

C7. The method of any of paragraphs C1-C6 in combination with any suitable structure, function, and/or feature of any suitable portion of any of the actuator assemblies of any of paragraphs A1-A40.

C8. The method of any of paragraphs C1-C7, wherein the actuator assembly includes the actuator assembly of any of paragraphs A1-A40.

As used herein, the terms "selective" and "selectively," when modifying an action, movement, configuration, or other activity of one or more components or characteristics of an apparatus, mean that the specific action, movement, configuration, or other activity is a direct or indirect result of user manipulation of an aspect of, or one or more components of, the apparatus.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

The various disclosed elements of apparatuses and steps of methods disclosed herein are not required to all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

The invention claimed is:

1. An actuator assembly, comprising:
a piezoelectric element having a first side and an opposed second side;
a first electrode in electrical communication with the first side, wherein the first electrode includes a flexible, electrically conductive membrane; and
a second electrode in electrical communication with the second side.

2. The actuator assembly of claim 1, wherein the flexible, electrically conductive membrane includes at least one of:
(i) an organic membrane;
(ii) a polymeric membrane;
(iii) a carbon fiber membrane; and
(iv) a mat-weave carbon fiber membrane.

3. The actuator assembly of claim 1, wherein the flexible, electrically conductive membrane is non-metallic.

4. The actuator assembly of claim 1, wherein the flexible, electrically conductive membrane has a Young's Modulus of at most 10 GPa.

5. The actuator assembly of claim 1, wherein the flexible, electrically conductive membrane has a membrane thickness of at least 10 micrometers and at most 250 micrometers.

6. The actuator assembly of claim 1, wherein the flexible, electrically conductive membrane is in direct physical contact with the first side of the piezoelectric element.

7. The actuator assembly of claim 1, wherein the first electrode further includes a metallic film, wherein the metallic film extends between, and electrically interconnects, the first side of the piezoelectric element and the flexible, electrically conductive membrane.

8. The actuator assembly of claim 7, wherein the metallic film has a film thickness of at least 0.01 micrometers and at most 5 micrometers.

9. The actuator assembly of claim 7, wherein the actuator assembly further includes an electrically conductive bonding agent that bonds the flexible, electrically conductive membrane to the metallic film.

10. The actuator assembly of claim 9, wherein the electrically conductive bonding agent includes at least one of:
(i) an electrically conductive adhesive;
(ii) an electrically conductive resin;
(iii) an electrically conductive epoxy;
(iv) a carbon-impregnated epoxy; and
(v) a carbon fiber-impregnated epoxy.

11. The actuator assembly of claim 7, wherein the metallic film, or the first metallic film, includes a plurality of film regions separated by a plurality of cracks and further wherein the flexible, electrically conductive membrane electrically interconnects, or shunts, the plurality of film regions.

12. The actuator assembly of claim 1, wherein the actuator assembly is at least one of:
(i) a unimorph piezoelectric actuator; and
a bimorph piezoelectric actuator.

13. A mechanical assembly, comprising:
a first structure including a first interface surface;
a second structure including a second interface surface; and
the actuator assembly of claim 1, wherein the actuator assembly is in mechanical contact with the first interface surface of the first structure and also with the second interface surface of the second structure and is configured to provide a motive force for relative motion between the first structure and the second structure.

14. The mechanical assembly of claim 13, wherein the assembly further includes:
a first electrical conductor in electrical communication with the first electrode;
a second electrical conductor in electrical communication with the second electrode; and
a voltage source configured to apply a voltage between the first electrode and the second electrode via the first electrical conductor and the second electrical conductor.

15. A method of fabricating the actuator assembly of claim 1, the method comprising:
defining the first electrode on the first side of the piezoelectric element, wherein the defining the first electrode includes operatively attaching the flexible, electrically conductive membrane to the first side of the piezoelectric element such that the flexible, electrically conductive membrane is in electrical communication with the first side of the piezoelectric element; and
defining the second electrode on the second side of the piezoelectric element.

16. The method of claim 15, wherein the defining the first electrode further includes defining a first metallic film on the first side of the piezoelectric element, wherein the defining the first metallic film is prior to the operatively attaching the flexible, electrically conductive membrane, and further wherein the operatively attaching the flexible, electrically conductive membrane includes operatively attaching such that the first metallic film extends between, and electrically separates, the first side of the piezoelectric element and the flexible, electrically conductive membrane.

17. The method of claim 16, wherein the defining the first metallic film includes depositing the first metallic film on the first side of the piezoelectric element.

18. The method of claim 15, wherein the flexible, electrically conductive membrane is a first flexible, electrically conductive membrane, and further wherein the defining the second electrode includes operatively attaching a second flexible, electrically conductive membrane to the second side of the piezoelectric element such that the second flexible, electrically conductive membrane is in electrical communication with the second side of the piezoelectric element.

19. The method of claim 15, wherein the defining the second electrode includes defining a second metallic film on the second side of the piezoelectric element.

20. The method of claim 19, wherein the defining the second metallic film includes depositing the second metallic film on the second side of the piezoelectric element.

* * * * *

UNITED STATES PATENT AND TRADEMARK OFFICE
CERTIFICATE OF CORRECTION

PATENT NO.      : 10,658,565 B2
APPLICATION NO. : 15/250174
DATED           : May 19, 2020
INVENTOR(S)     : Daniel John Clingman Page 1 of 1

It is certified that error appears in the above-identified patent and that said Letters Patent is hereby corrected as shown below:

In the Claims

Claim 12, Column 15, Line 45, add --"(ii)"-- at the beginning of the line before "a bimorph piezoelectric actuator."

Signed and Sealed this
Eighteenth Day of August, 2020

Andrei Iancu
*Director of the United States Patent and Trademark Office*